US006940445B2

(12) United States Patent
Kearney

(10) Patent No.: US 6,940,445 B2
(45) Date of Patent: Sep. 6, 2005

(54) PROGRAMMABLE INPUT RANGE ADC

(75) Inventor: Thomas Paul Kearney, Cork City (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/807,778

(22) Filed: Mar. 24, 2004

(65) Prior Publication Data

US 2005/0151680 A1 Jul. 14, 2005

Related U.S. Application Data

(63) Continuation-in-part of application No. 10/330,717, filed on Dec. 27, 2002, now Pat. No. 6,731,232.

(51) Int. Cl.[7] .............................................. H03M 1/34

(52) U.S. Cl. ...................... 341/163; 341/144; 341/155

(58) Field of Search ............................... 341/163, 144, 341/155, 172

(56) References Cited

U.S. PATENT DOCUMENTS

| 4,348,658 | A | | 9/1982 | Carter | 341/136 |
| 5,684,487 | A | | 11/1997 | Timko | 341/172 |
| 5,694,356 | A | | 12/1997 | Wong et al. | 365/185.03 |
| 5,861,831 | A | | 1/1999 | Murden et al. | 341/139 |
| 6,075,478 | A | | 6/2000 | Abe | 341/155 |
| 6,144,331 | A | | 11/2000 | Jiang | 341/172 |
| 6,307,497 | B1 | | 10/2001 | Leung et al. | 341/155 |
| 6,388,589 | B1 | | 5/2002 | Arai | 341/78 |
| 6,731,232 | B1 | * | 5/2004 | Kearney | 341/163 |
| 2002/0126033 | A1 | | 9/2002 | Semmler et al. | 341/158 |

FOREIGN PATENT DOCUMENTS

| EP | 0935195 | 8/1999 |
| WO | WO 99/37027 | 7/1999 |

OTHER PUBLICATIONS

International Search Report, 1999.
Myers, F. et al, "Integration of high voltage transistors into a 1.5 micron CMOS process for LCD driver applications", IEEE 1993 Custom integrated circuits conference, pp. 24. 7.1-4.
McCreary, J.L. and Gray, P.R., "All-MOS charge redistribution analog-to-digital conversion techniques—Part 1", IEEE J. Solid State Circuits, pp. 312-320, 1975.

* cited by examiner

Primary Examiner—Peguy JeanPierre
(74) Attorney, Agent, or Firm—Wolf, Greenfield & Sacks, P.C.

(57) ABSTRACT

A programmable input voltage range analog-to-digital converter in which a split gate oxide process allows the use of high voltage (±15 volt) switches on the same silicon substrate as standard sub-micron 5 volt CMOS devices. With this process, the analog input voltage can be sampled directly onto one or more sampling capacitors without the need for prior attenuation circuits. By only sampling on a given ratio of the sampling capacitors, the analog input can be scaled or attenuated to suit the dynamic range of a subsequent ADC. In the system of the present invention, the sampling capacitor can be the actual capacitive redistribution digital-to-analog converter (CapDAC) used in a SAR ADC itself, or a separate capacitor array. By selecting which bits of the CapDAC or separate sampling array to sample on, one can program the input range. Once the analog input signal has been attenuated to match the allowed dynamic range of the SAR converter, traditional SAR techniques can be used to convert the input signal to a digital word. Other conversion technologies, such as sigma-delta and pipeline, can also be used in conjunction with the inventive system.

55 Claims, 10 Drawing Sheets

PROGRAMMABLE INPUT RANGE ADC

RELATED APPLICATIONS

This application is a continuation-in-part of U.S. patent application Ser. No. 10/330,717, filed Dec. 27, 2002 now U.S. Pat. No. 6,731,232.

FIELD OF THE INVENTION

This invention relates generally to scaling of analog input signals and in particular to scaling both bipolar and unipolar input signals to the dynamic range of an ADC prior to acquisition and conversion, and is more particularly directed toward sampling an analog input signal through high-voltage transmission gates onto a selected combination of sampling capacitors to program the input range of an ADC.

BACKGROUND OF THE INVENTION

Multi-input, wide dynamic range bipolar and unipolar analog-to-digital converters (ADCs) have traditionally used resistor divider networks at the analog input to scale the input signal to the dynamic range of the converter before acquisition and conversion can take place. This method of attenuating the input signal prior to conversion by the ADC has been used very successfully in the past. However, it has a number of distinct disadvantages.

First of all, in the traditional resistor divider approach the analog input source always sees a resistive load to ground or some reference voltage. The source must be able to drive this load. Second, the resistor divider network consumes power both from the internal reference and from the analog input source. The third problem is that this prior art technique does not allow the user an easy method for programming the allowed analog input range. A fourth disadvantage is the fact that the size of the input resistors will limit the full power bandwidth of the converter.

The nodes of the resistor network that form the resistor divider can be made accessible to the user via pins on an integrated circuit (IC). The user then configures the resistor divider network via hardware connections to suit the analog input range required. However, if the user wishes to change the range, then the hardware has to be re-wired.

It is known in the prior art to construct an analog-to-digital converter integrated circuit using a process utilizing only 5 volt devices. This ADC is a successive approximation ADC implemented using a capacitor array DAC (CapDAC). The internal reference (Vref) is set at one-half the 5 volt supply voltage, or 2.5 volts. This particular device can accommodate two different input voltage ranges by sampling onto the full CapDAC for the 0 to Vref range, and half the array for the 0 to 2×Vref range. Of course, the maximum input voltage is limited to 5 volts. This device is available from Analog Devices, Inc. as their part number AD7866.

It has also been suggested that higher input voltages can be accommodated by fabricating the entire device using a high-voltage process. In the December 1975 *IEEE Journal of Solid State Circuits*, authors James L. McCreary and Paul R. Gray describe a SAR ADC fabricated entirely with a high-voltage process that can handle ±10 volt supplies. With the reference voltage set at 10 volts, the device can handle a 0 to 10 volt input voltage range by sampling onto its entire capacitor DAC array, and can thus accommodate an input voltage range from −10 volts to +10 volts by sampling onto just half of the CapDAC array. Presumably, the gate lengths for the devices described in this article are on the order of 6 microns, thus consuming considerable die area for a single device.

Consequently, a need arises for an analog input voltage scaling technique that is easily adaptable to integrated circuit applications, does not require the input signal to drive a resistive load to ground, minimizes power consumption, and is easily programmable in the event that the allowed analog input voltage range requires alteration.

SUMMARY OF THE INVENTION

These needs and others are satisfied by the programmable input voltage range system and methodology of the present invention, in which a split gate oxide process allows the use of high voltage switches (±15 volts, for example) on the same silicon substrate as standard sub-micron 5 volt CMOS devices. With this process, the analog input voltage can be sampled directly onto the sampling capacitor without the need for prior attenuation circuits. By only sampling on a given ratio of the sampling capacitor, the analog input can be scaled or attenuated to suit the dynamic range of the ADC itself.

The system of the present invention is applicable to ADC implementations in which the input signal is sampled prior to data conversion. One example of such a system uses a successive approximation ADC, or SAR ADC, for data conversion. In a system such as this, the sampling capacitor can be the actual capacitive redistribution digital-to-analog converter (CapDAC) used in the SAR ADC itself, or a separate capacitor array. By selecting which bits of the CapDAC or separate sampling array to sample on, one can program the input range. Once the analog input signal has been attenuated to match the allowed dynamic range of the SAR converter, traditional SAR techniques can be used to convert the input signal to a digital word.

In this manner, many of the problems of traditional methods are overcome. The analog source sees a capacitive load, not a resistive load to ground—therefore, no DC power is required from the source. Second, no additional power is consumed in biasing a resistor divider network. And last of all, by selecting which bits of the capacitive redistribution DAC or separate sampling array to sample onto, one can program, through software, the analog input range.

In essence, the present invention uses the capacitor array to scale the analog input into the range of the ADC. However, it differs from the prior art in a number of ways. Devices of the prior art can operate only in ranges limited by the supply to the core converter being used. In the present invention, there is a combination of high-voltage and low-voltage MOSFETs on the same silicon substrate. Thus, the present invention is not limited by the ADC's supply, but only by the high voltage supply—which only supplies the sampling switches. So one can take advantage of the speed and circuit density of a sub-micron low-voltage process ADC to perform the actual conversions, while using the high-voltage switches, the capacitor array, and some digital logic to vary the range by multiples of the reference voltage (up to a limit of the high voltage supplies).

This dual-voltage device technology has not previously been available. Hence if a designer wished to use a fast, sub-micron, low-voltage ADC to convert large signals (large meaning outside the 0 to 5 v range), the designer would have to devise some way to scale the input voltage using resistors before applying it to the ADC. The new technology allows the designer to return to capacitor implementations in order to do this, with all of their inherent advantages.

In accordance with one aspect of the present invention, a programmable input voltage range analog-to-digital converter comprises an analog-to-digital converter (ADC) having a characteristic dynamic range, and an input voltage scaling network in which the input voltage is sampled onto one or more selected sampling capacitors to scale the input voltage to substantially match the characteristic dynamic range of the ADC. In one form of the invention, the input voltage scaling network comprises an array of parallel-connected sampling capacitors in an input amplifier providing a sampled input voltage to the ADC. In the case of a SAR ADC, the input amplifier may be a sample-and-hold amplifier (SHA).

The sampling capacitors may be interposed between the analog input voltage and an input amplifier from which the sampled output signal is derived. The ADC itself may be, for example, a sigma-delta converter, a pipeline converter, or a successive approximation converter.

A network of high voltage sampling switches may be interposed between the input voltage and the input voltage scaling network, such that range decoder logic selects one or more elements of the input voltage scaling network on which the input voltage is sampled. The input voltage range may be bipolar.

In another form of the invention, a network of low-voltage to high-voltage level shifters couples control signals to the high voltage sampling switches. Preferably, the range decoder logic is responsive to a range selection control word written into an associated range register. The range register may be programmable via a digital communication interface. It is preferred that the digital communication interface be a serial, bi-directional communication interface to accommodate both programming of the range register by a user, and read-back of the range register contents for verification, as well as for programming other functionality of the ADC itself.

In accordance with yet another aspect of the present invention, a programmable input voltage range analog-to-digital converter integrated circuit device fabricated on a single substrate comprises an analog-to-digital converter (ADC) subsystem fabricated utilizing a standard sub-micron low-voltage CMOS process, and having a characteristic dynamic range, an input voltage scaling network in which the input voltage is sampled onto one or more selected sampling capacitors to scale the input voltage to substantially match the characteristic dynamic range of the ADC, and a network of high-voltage MOS sampling switches fabricated utilizing a split gate oxide process to accommodate higher gate voltages, the network of high-voltage sampling switches interposed between the input voltage and the input voltage scaling network, such that the input voltage is selectively sampled onto one or more of the sampling capacitors.

Further objects, features, and advantages of the present invention will become apparent from the following description and drawings.

DETAILED DESCRIPTION OF THE INVENTION

Figure 1:
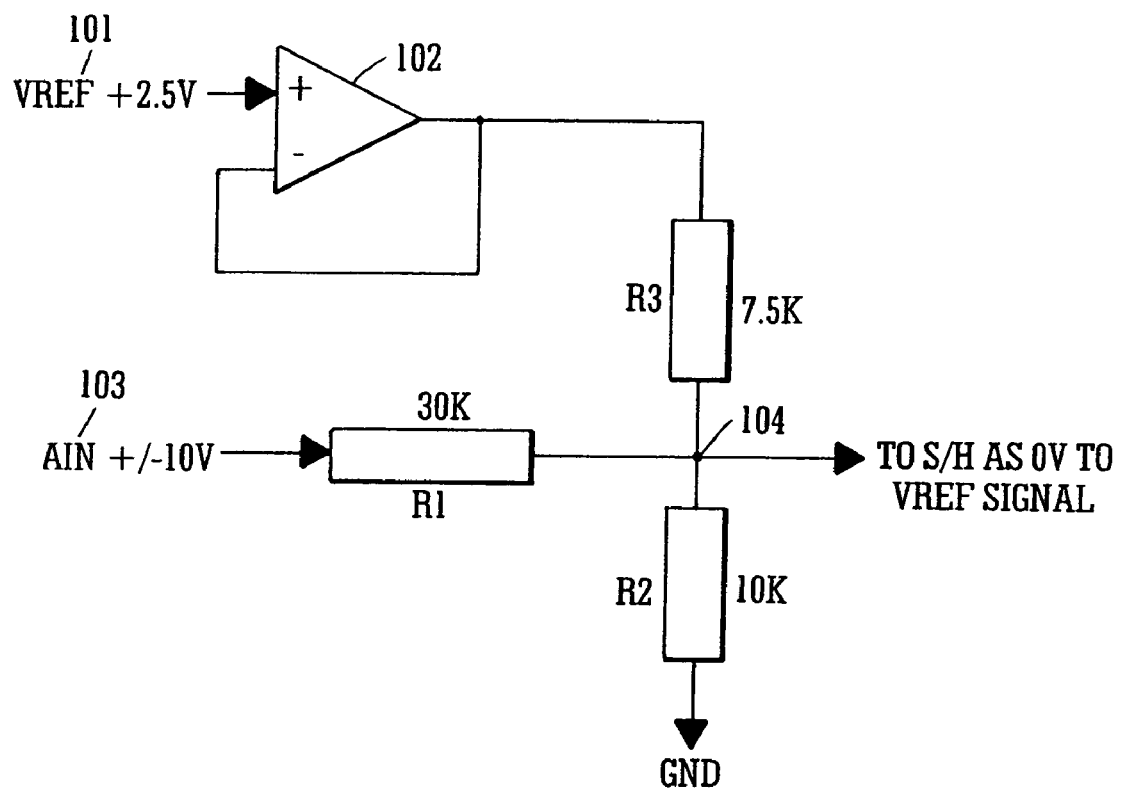
FIG. 1 depicts a resistor divider circuit of the prior art used to attenuate analog input signals prior to conversion.

There is described herein a programmable input range ADC that offers distinct advantages when compared to the prior art. In one form of the invention, the conversion system may be implemented as a SAR ADC. FIG. 1 illustrates the traditional method used to attenuate wide range bipolar and unipolar analog input signals prior to conversion. A reference voltage Vref, in this example +2.5 volts, is applied to the input of a buffer 102. The buffered reference voltage is applied to the top of a resistor divider formed from resistors R1, R2, and R3.

The analog input signal Ain, which, in this exemplary circuit, ranges between −10 volts and +10 volts, is applied to the voltage divider input 103. The reference voltage Vref serves as a bias voltage for the voltage divider, with the result that the divider network scales and level-shifts the input signal. The analog input voltage Ain, as it varies from −10 volts to +10 volts, produces a variation at the common node 104 from zero volts to +2.5 volts. It is this output node 104, with its scaled output voltage, that is generally coupled to the sample and hold input of a SAR ADC. It should be noted that the analog input signal Ain in this prior art network must drive 40 K (kilohms) to ground.

Figure 2:
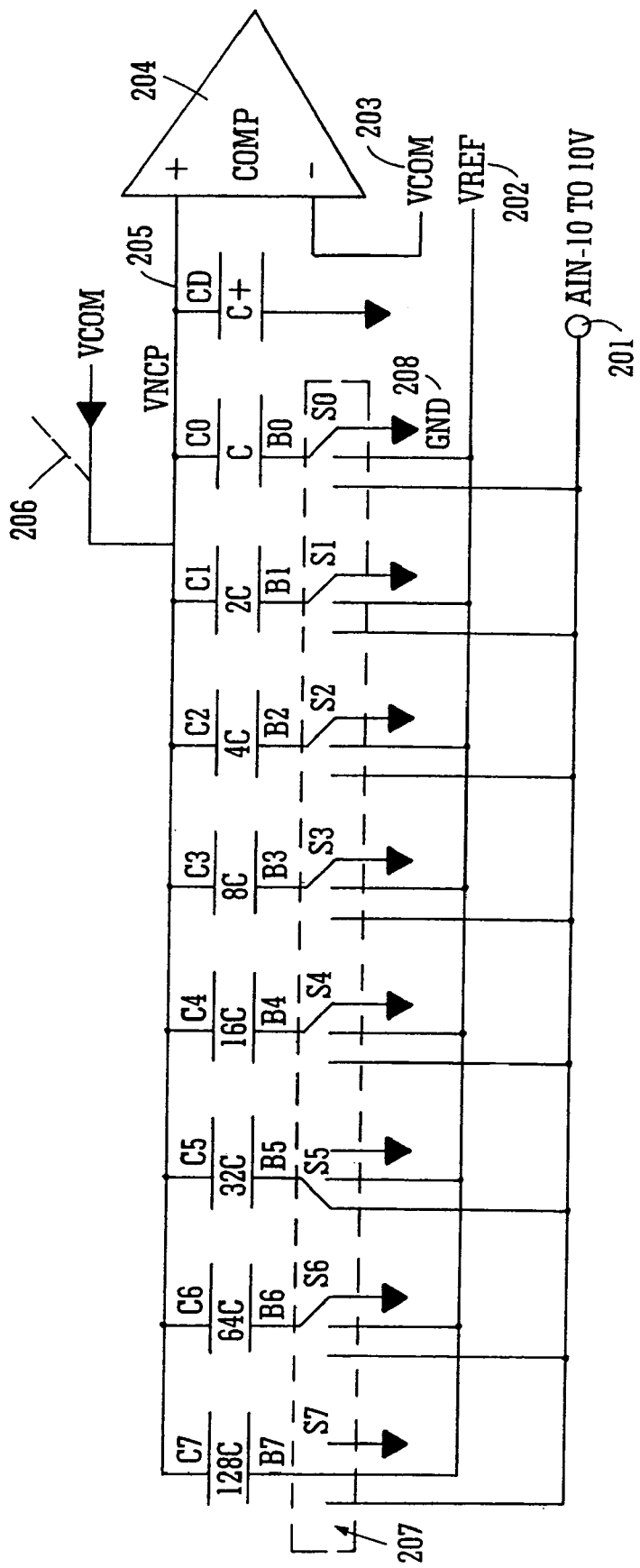
FIG. 2 illustrates a bipolar analog input signal being sampled onto a CapDAC array in accordance with the principles of the present invention.

FIG. 2 illustrates a bipolar (±10 volt) analog input signal being sampled onto an 8-bit CapDAC array in accordance with one form of the present invention. The switches to the analog input signal are ±15 volt switches that are capable of directly sampling the bipolar input signal. The switches are described in greater detail below.

It should be noted with respect to FIG. 2 that the comparator and all the SAR logic of the ADC can be implemented using 5 volt sub-micron CMOS technology. Only the analog input switches are required to be fabricated using ±15 volt CMOS devices that use a thicker gate-oxide to deal with the higher gate voltages required.

The charge equation during sampling for the ±10 volt input range is as follows:

$$Q_{ncp}=C_{tot}*\{-Ain*(32C/256C)+V_{com}\}=C_{tot}*V_{ncp} \quad (1)$$

Where $C_{tot}=256C$

That is, the analog input voltage sampled will be:

$$V_{ncp}=-Ain/8+V_{com} \quad (2)$$

If $V_{com}$ is equal to 1.25 volts, then, for any analog input voltage in the range ±10 volts, the sampled analog input is between 0 volts and 2.5 volts. If the reference voltage is 2.5 volts, then the analog input is kept within the dynamic range of the converter, and the bipolar input signal can be converted using the usual SAR techniques.

In order to program the input range, one simply selects which bits of the CapDAC array to sample onto. This is illustrated for an 8-bit example in Table 1 below:

| Input Range | MSB B7 | B6 | B5 | B4 | B3 | B2 | B1 | LSB B0 | $V_{ncp}$ after sampling |
|---|---|---|---|---|---|---|---|---|---|
| ±10 volts | Vref | GND | Ain | GND | GND | GND | GND | GND | $-Ain/8 + V_{com}$ |
| ±5 volts | Vref | Ain | GND | GND | GND | GND | GND | GND | $-Ain/4 + V_{com}$ |
| ±2.5 volts | Vref | Ain | Ain | Ain | Ain | Ain | Ain | Ain | $-Ain/2 + V_{com}$ |
| 0 to +10 v | GND | Ain | GND | GND | GND | GND | GND | GND | $-Ain/4 + V_{com}$ |
| 0 to +5 v | GND | Ain | Ain | Ain | Ain | Ain | Ain | Ain | $-Ain/2 + V_{com}$ |
| 0 to +2.5 v | Ain | Ain | Ain | Ain | Ain | Ain | Ain | Ain | $-Ain + V_{com}$ |

In this example, only three bits are needed to select the range: a polarity bit (to indicate whether the input signal is bipolar or unipolar) and two range bits. Table 2 below illustrates the selection bit values for a number of input ranges.

| Input Range | Polarity Bit | Range Bit1 | Range Bit0 |
|---|---|---|---|
| ±10 volts | High | Low | Low |
| ±5 volts | High | Low | High |
| ±2.5 volts | High | High | High |
| 0 to +10 v | Low | Low | Low |
| 0 to +5 v | Low | Low | High |
| 0 to +2.5 v | Low | High | High |

It should be noted that for bipolar signals the MSB (the Polarity Bit) is held at the reference voltage during sampling. The reason for this will become apparent later in the description.

As noted above, FIG. 2 illustrates a capacitive redistribution DAC, or CapDAC, comprised of a collection of binary weighted capacitors $C_7$ through $C_0$, and a "dummy" capacitor (or terminating capacitor) $C_D$ located closest to the comparator 204. The value of $C_D$ is substantially equal to the capacitance of the LSB capacitor $C_0$. In the circuit of FIG. 2, the terminating capacitor does not sample the analog input, but is rather held at ground to help with minimizing offsets. The 8-bit capacitor array of FIG. 2 is shown in sample mode. The total capacitance of the array is 256C, where C is the unit capacitance for the illustrated implementation.

In this exemplary embodiment, the MSB B7 is tied to Vref 202 during sampling by switch S7, part of the array 207 of analog switches that will be discussed further below. The third most significant bit, B5, is tied to the analog input voltage 201 through switch S5. When the sampling period is completed, the charge accumulated from the analog input is transferred to the top plate of the capacitor array by switching S5 to ground 208. The common mode switch 206 is opened first so that total charge across the sampling capacitor is conserved.

Thus, in this example, the analog input signal is attenuated by a factor of 8. Therefore, assuming an input signal that varies between +10 and −10 volts, the comparator 204 actually sees ±1.25 volts. If the common mode voltage Vcom 203 is 1.25 volts, then the input signal is kept within the common mode range of the comparator 204. Known successive approximation techniques can then be used to digitize the input signal.

An examination of the MSB bit trial is instructive. As noted previously, the MSB was tied to Vref (2.5 volts) during sampling. Post-sampling, the MSB remains at Vref until a decision is made regarding what to do with the MSB. Just by way of example, if the analog input signal happened to be positive (+10 volts, for example), the voltage at the non-inverting input of the comparator (the NCP node 205) would be given by equation (2) above as $-Ain/8+Vcom$. In the case where the common mode voltage Vcom is +1.25 volts, then $V_{ncp}=0$ volts. The output of comparator 204 would be a logic LOW level.

One would expect to have the NCP node converge to the common mode voltage. In order to accomplish this, the MSB is left connected to Vref, since switching this point to ground would transfer negative charge to the top plate of the capacitor array and cause the NCP voltage to diverge from the common mode voltage. The SAR logic can be structured to set the first bit of the data output to a logic "1" under these circumstances, since the logic will know that the input is bipolar.

The second MSB B6 bit trial begins by switching B6 from ground to Vref using switch S6. This transfers a positive charge of weighting Vref/4 to the top plate of the capacitor array. The equation for the NCP voltage 205 now becomes:

$$V_{ncp}=-Ain/8+V_{com}+Vref/4 \quad (3)$$

Since the sampled analog input signal in this example was +10 volts, the common mode voltage is +1.25 volts, and the reference voltage Vref is +2.5 volts, the voltage at the NCP node 205 is 0.625 volts. The comparator output is still a logic LOW, but the NCP voltage is beginning to converge on the common mode voltage. Hence, the second MSB B6 is left tied to Vref and the SAR logic interprets this as a logic "1" and sets the second bit of the data output to "1." The remaining bit trials occur in the same fashion until all 8 bits have been tested and the NCP node 205 is within 1 LSB of the common mode voltage.

In the event that the analog input voltage were negative, the opposite would occur. If an input voltage of −10 volts were applied as the analog input signal, equation (2) above indicates that the NCP node voltage would be 2.5 volts. The comparator output would be a logic HIGH and the SAR logic would interpret this, switch the MSB from Vref to ground, and set the first bit of the data output to a logic "0." For the second MSB bit trial, B6 would be switched to Vref, the NCP node would settle to +1.875 volts, and the comparator output would still be HIGH. The SAR logic would reject this bit by switching it to ground. Thus, the SAR process would continue until the NCP node converges on the common mode voltage. An equation for the NCP voltage during bit trials is given by equation (4) below:

$$V_{ncp} = -Ain/8 V_{com} + [-\overline{B7}*(Vref/2) + B6*(Vref/4) + \ldots + B0*(Vref/256)]$$

The Vref/2 term (the MSB) has a negative sign and is also multiplied by the inverse of bit 7. This is because the Vref/2 term is only included when B7 is a logic "0" (i.e., if the actual analog input voltage is negative in polarity). Hence, the MSB behaves like a sign bit.

Figure 3:
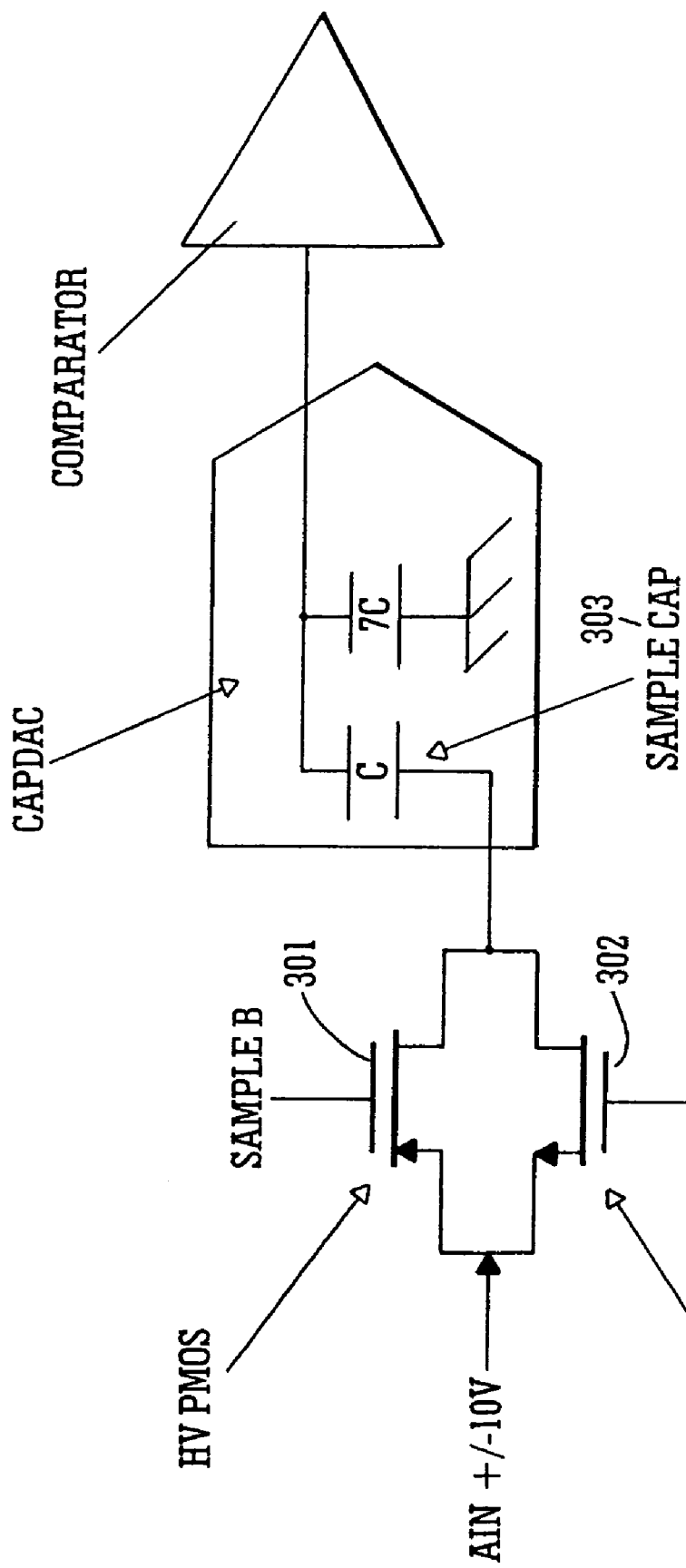
FIG. 3 is a simplified diagram of a switching transistor arrangement suitable for use in the present invention.

FIG. 3 is a simplified diagram of a switching arrangement suitable for use in the present invention. In order to accommodate analog input signals in the range from −10 to +10 volts, a transmission gate is formed from a pair of parallel connected, high voltage PMOS 301 and NMOS 302 transistors. Preferably, the devices illustrated will withstand a 30 volt differential between any two terminals, and provide an adequate safety margin when dealing with input signals in the ±10 volt range.

Of course, the ranges described are simply examples. Using proper fabrication techniques, the devices used as switches could be designed to operate with other supply voltages and input voltage ranges as well. The voltages selected in the exemplary embodiment described herein are illustrative of the fact that an integrated circuit can now be fabricated efficiently to include devices having widely disparate operating voltages.

The high voltage devices 301, 302 take the analog input signal and switch it directly onto a sampling capacitor 303. Of course, high voltage control signals are required for the gates of the high voltage transistors 301, 302, but these control signals can be provided by simple level shifting from 5 volt CMOS levels.

The actual process technology that allows high-voltage and low-voltage MOS devices to reside on a single silicon substrate involves utilizing a standard sub-micron CMOS process with additional processing steps. These steps may include construction of a buried layer, isolation wells for the high voltage devices, and thicker gate oxide for the high-voltage devices when compared with the low-voltage CMOS, for example. Considerable care must be exercised, in both the layout and the process, to ensure that no low-voltage device is too closely proximate one of the high-voltage devices.

Figure 4:
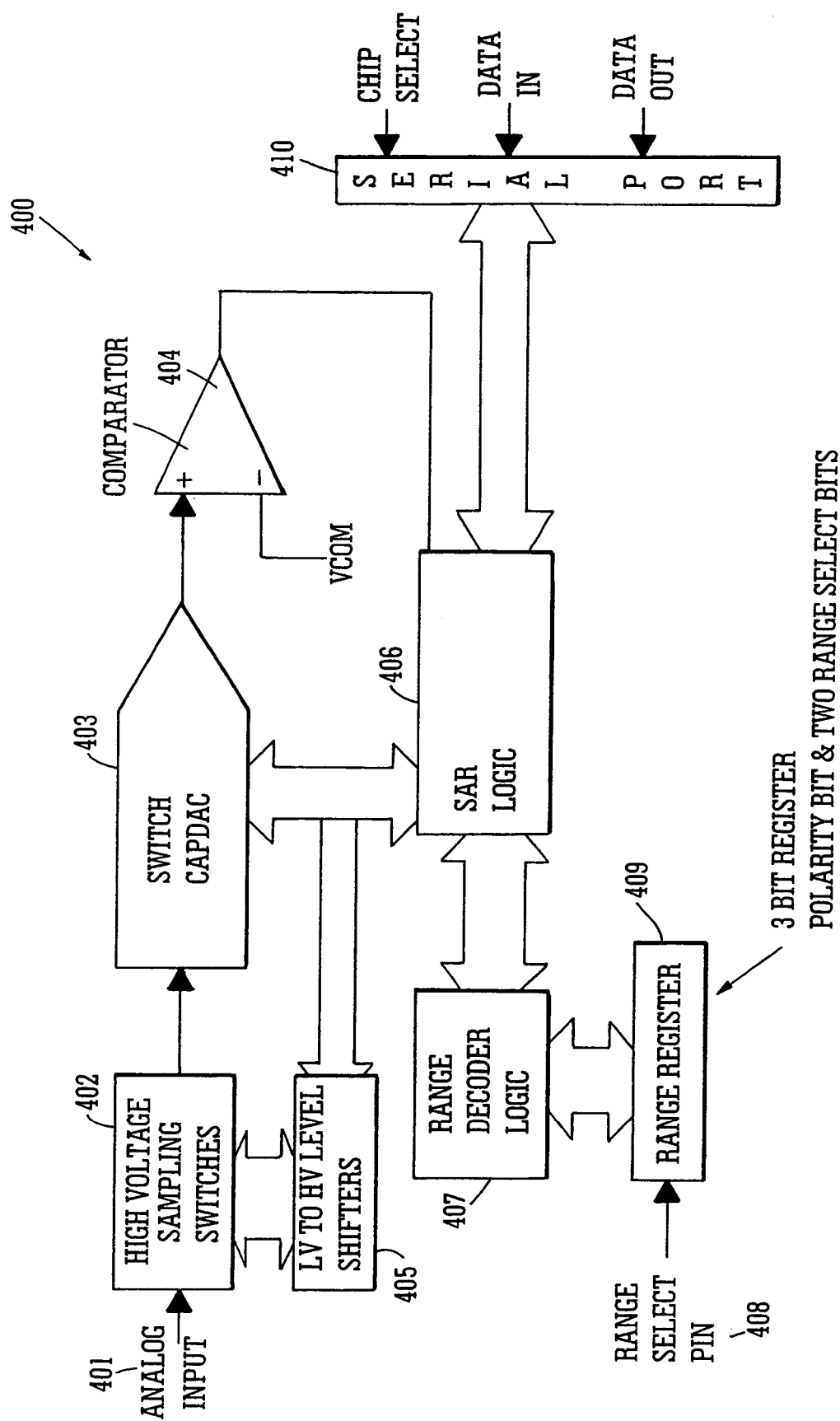
FIG. 4 is a block diagram of a complete SAR ADC incorporating the principles of the present invention.

FIG. 4 is a block diagram of a complete SAR ADC system incorporating programmable input range features in accordance with the present invention, and generally depicted by the numeral 400. An analog input signal 401 is applied to one or more capacitors of a CapDAC array 403 through an array of high-voltage switches 402. The SAR logic 406, which also controls signal acquisition and conversion in a known manner, controls which capacitors of the CapDAC array the input signal is sampled onto.

The SAR logic 406 does this based upon range decoder logic 407 that receives a range programming input from a range register 409. The range decoder logic 407 is described in greater detail subsequently. It is sufficient for the moment to note that the contents of the range register 409 may be altered by writing to the register over a conventional serial port 410. Allowing the user to access the range register 409 provides a software programming capability for the range of the SAR ADC 400.

Figure 5:
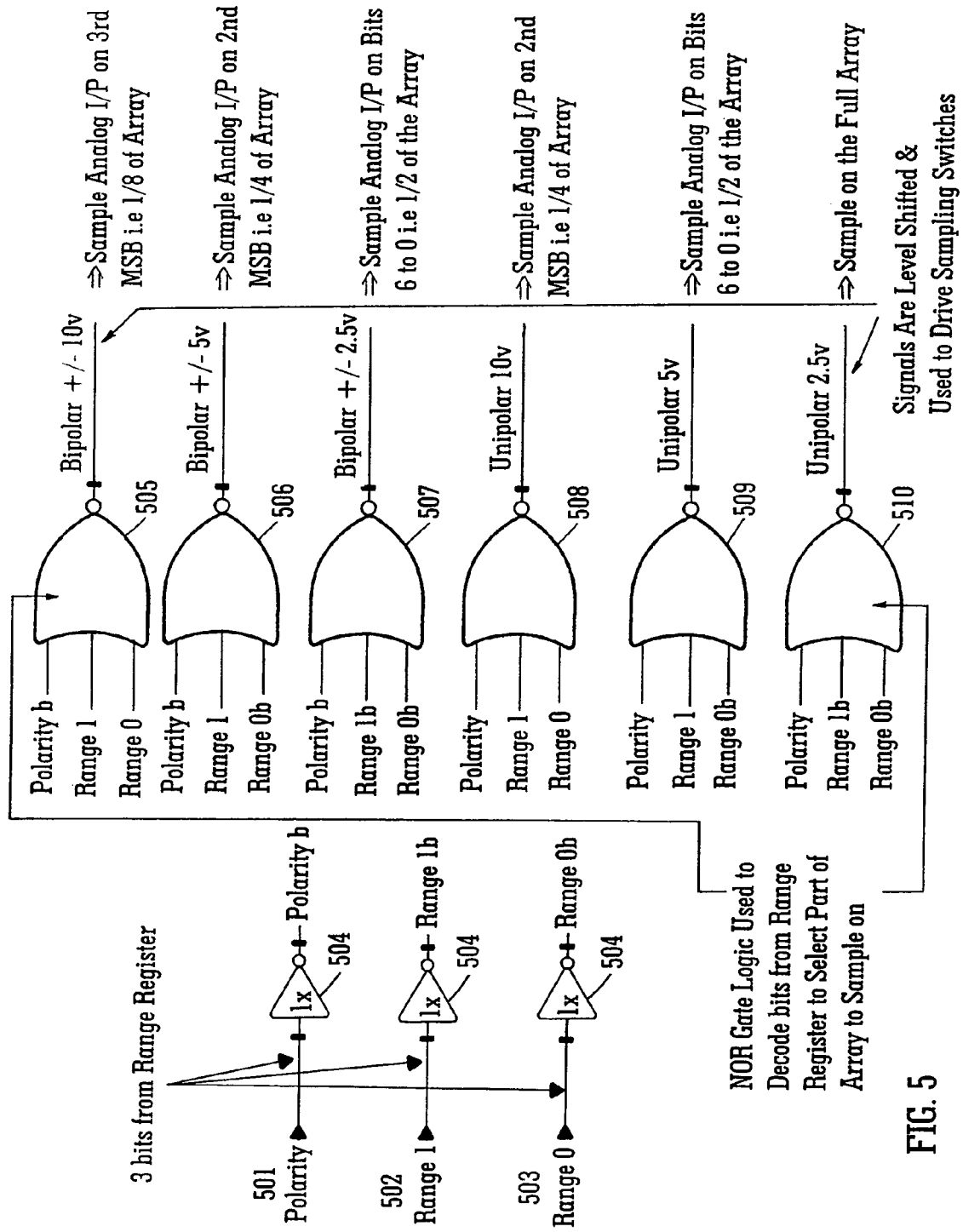
FIG. 5 depicts range decoder logic suitable for use with the present invention.

FIG. 5 provides a detailed view of the range decoder logic. Of course, a number of logic implementations would suffice for this application. The implementation of FIG. 5 is simply one satisfactory way of generating a suitable set of ranges for the SAR ADC. There are three input signals that control the range of the SAR ADC. These are the Polarity Bit 501, the Range1 Bit 502, and the Range0 Bit 503. Each of these signals is applied to an inverter 504 so that both the signals and their logic complements are available to the decoder section.

The decoder itself is an array of NOR gates to which unique combinations of the input signals and their complements are applied. For example, the complement of the Polarity Bit 501, along with the Range1 and Range0 bits are applied to NOR gate 505 in the event that the analog input signal is bipolar with an expected voltage swing between −10 and +10 volts. As illustrated, the input signal is sampled onto the third MSB of the CapDAC array in this case for proper scaling. Unique combinations of the control bits are mapped onto the inputs of different NOR gates so that six different input ranges may be selected for the SAR ADC via software programming.

Figure 6:
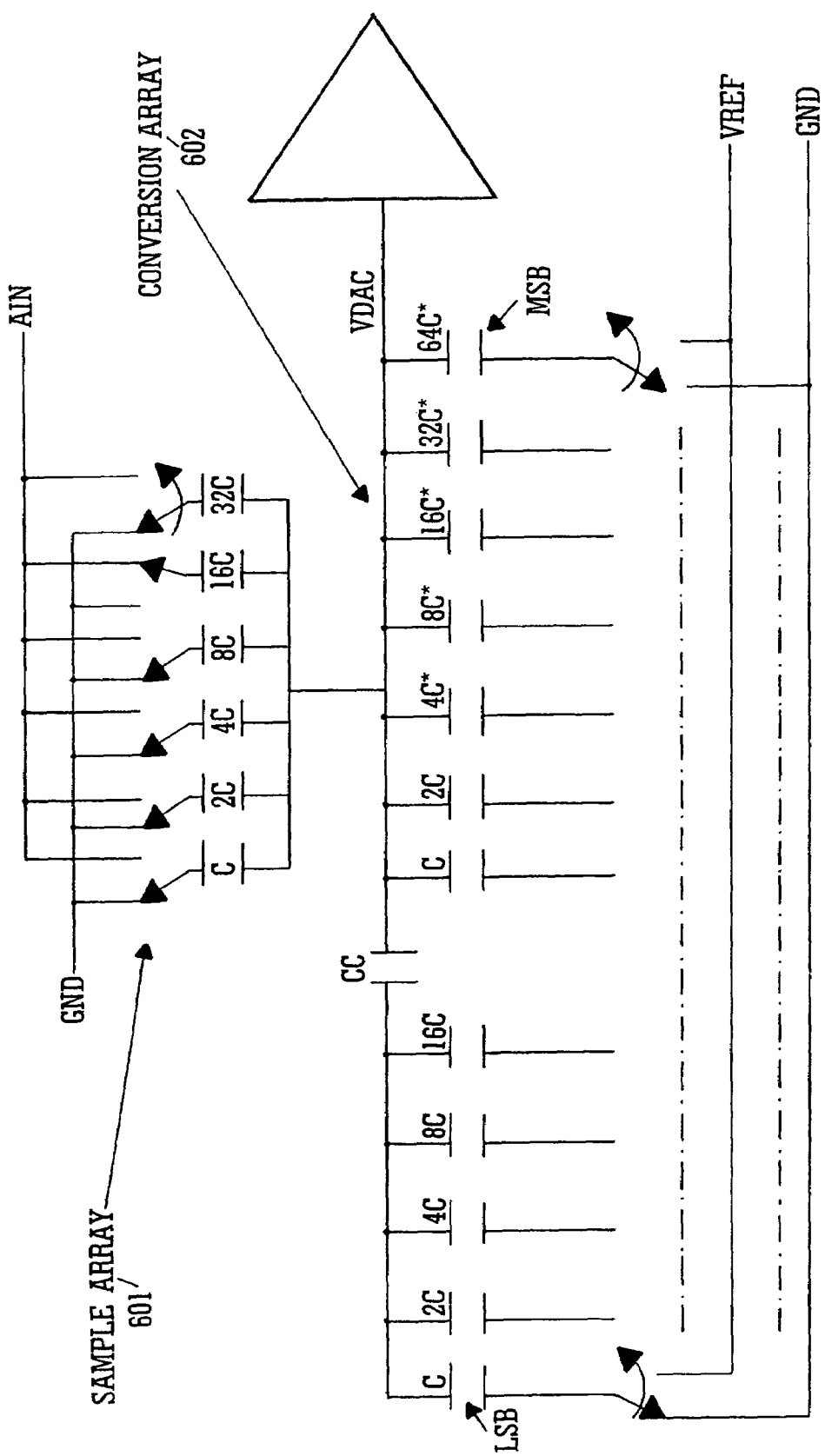
FIG. 6 illustrates a sampling array separate from the conversion array in accordance with an alternative embodiment of the present invention

FIG. 6 illustrates an alternative embodiment of the invention in which the analog input signal is sampled onto a separate sample array 601, rather than electing to sample directly onto selected capacitors of the CapDAC conversion array 602. In this implementation, the selection logic selects one or more elements of the sample array 601 in order to program the range of the SAR ADC. The principal advantage of this configuration is that the number of high voltage switches required is substantially reduced. As one would expect, there is an associated saving in die area as well if a separate sampling array is used.

As noted previously, the system of the present invention may be implemented with a SAR ADC for performing data conversion. However, the present invention is also readily adaptable to any conversion technology in which the analog input signal is sampled onto some form of memory device (a capacitor, for example) before being converted. It is worthwhile considering the subject of sampling an analog signal yet again, before delving further into available data conversion technologies.

The majority of analog to digital converters operate on the principle that, at some point in time, the signal to be converted must be sampled onto some form of a memory device. The stored signal can then be converted into a digital word by known conversion techniques/architectures. It is usual (although not necessary) to use a capacitor as the memory device for storing the sampled analog signal.

Figure 7:
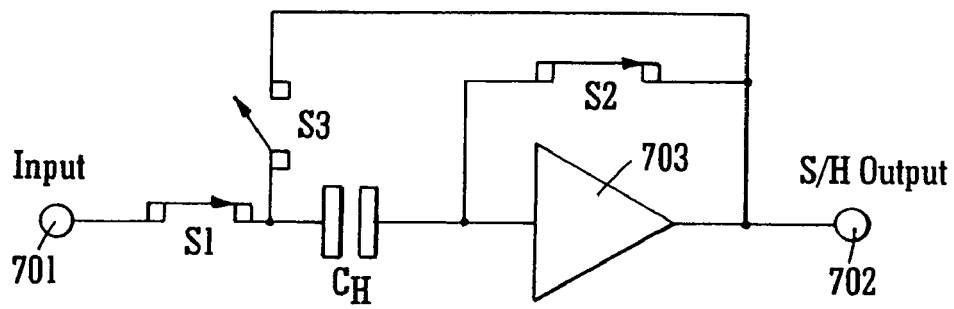
FIG. 7 is a schematic diagram of a typical sample and hold circuit.

An example sample-and-hold (S/H) circuit is the switched capacitor circuit of FIG. 7. This circuit is made up of three basic elements: switches S1, S2, and S3, a capacitor $C_H$ for sampling the input, and a transconductance amplifier 703. During sampling, S1 and S2 are closed, while S3 is open. The capacitor $C_H$ is charged to the input voltage 701—this time period is usually called the track time. When S1 and S2 are opened and S3 is closed, the circuit switches into a hold mode. The stored analog input signal on the capacitor $C_H$ is connected between the input and the output of the transconductance amplifier 703—hence the analog input voltage appears at the S/H output 702. By connecting this output node 702 to an analog to digital converter, one can convert the signal to a digital word. It should be noted that the analog to digital converter does not have to be of any particular type or architecture.

This sample and hold circuit illustrated in FIG. 7 is the basic building block for a sampled system. If one were to add extra capacitance to the top plate of capacitor $C_H$ one can increase the size of the total sampling capacitance. However, suppose we only wish to sample onto a fraction of the sampling capacitor. We would then scale the actual voltage seen at the S/H output in accordance with the following relationship:

$$Vout=Vin \times (C_H/C_{TOTAL}) \qquad (5)$$

If $C_{TOTAL}=8 \times C_H$ then we have scaled the input by 8. Now suppose we introduce high-voltage switches into the circuit as discussed previously. The circuit of FIG. 8 includes a bank of switches and capacitors on the analog input side of the sampling circuit. Each unit capacitor of value $C_H$ has a switch to ground and a switch to the analog input. By programming which switches are connected to ground, and which switches are connected to the analog input voltage, during the sampling period (track period), one can scale the analog input to the desired range of a subsequent analog to digital converter.

Now suppose the switches are all made up of high-voltage devices as described with respect to previous embodiments of the present invention. Wide range signals can be attenuated as per equation (5). For +/−10 v signals, only sample on $1 \times C_H$ (i.e., divide by 8). For +/−5 v signals, sample onto $2 \times C_H$ (i.e., divide by 4), and so on.

Thus, any type of converter that requires the input signal to be sampled in time before conversion to a digital word takes place can be used in conjunction with the technique of the present invention. The exemplary embodiments of the present invention described previously used a SAR architecture as a convenient example, especially since SAR ADC operation lends itself well to a detailed explanation of the basic idea. However, any architecture requiring an input signal to be sampled onto a memory device could be used. Usable converter architectures specifically include sigma-delta converters and pipeline converters. Of course, a sigma-delta converter does not generally use a sample and hold amplifier, but merely an input amplifier circuit that may function as a switched capacitor integrator, for example.

Figure 15:
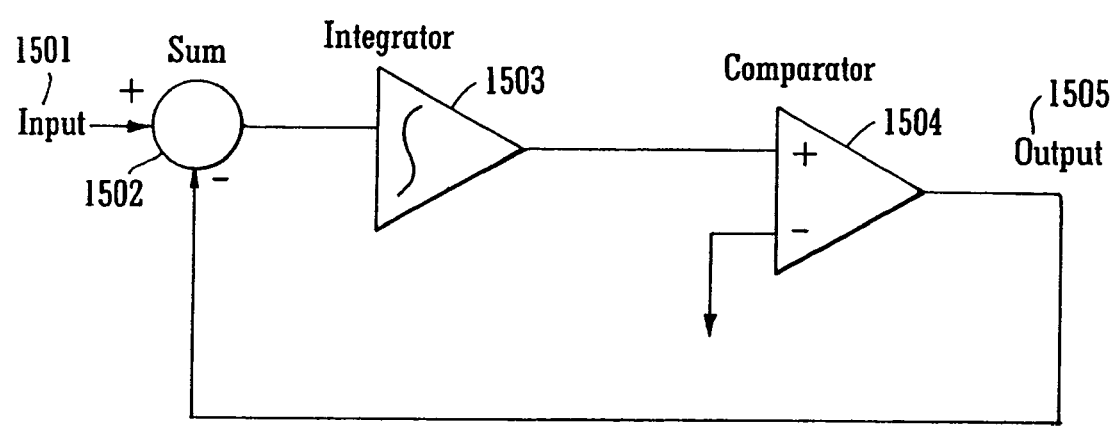
FIG. 15 is a representation of a first order sigma-delta style analog-to-digital converter.

FIG. 15 illustrates one form of a sigma-delta analog-to-digital converter in which an integrator 1503 is placed in a loop with a comparator 1504. An analog input signal 1501 is converted to a bit stream of 1's and 0's (i.e., a digital word), in which the "ones density" will be proportional to the magnitude of the analog input signal. In conjunction with specialized digital filtering of the output bit stream, an analog-to-digital converter can be readily achieved.

Figure 9:
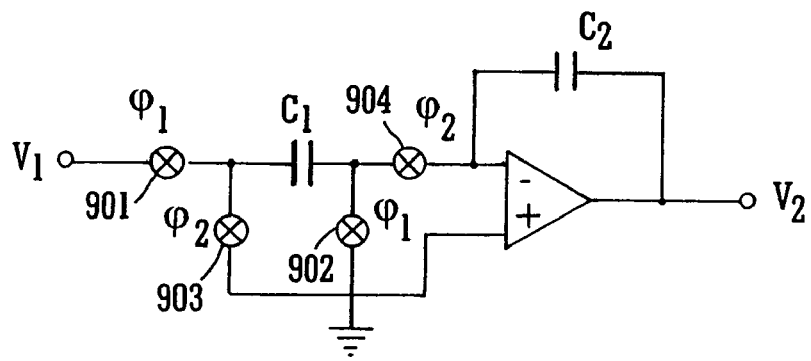
FIG. 9 illustrates a switched capacitor integrator.

Perhaps the most important of the basic building blocks of a sigma delta converter is the switched capacitor integrator that implements the sum 1502 and integrator 1503 portions of the sigma-delta converter of FIG. 15. FIG. 9 depicts a switched capacitor integrator in schematic diagram form. The switched capacitor integrator is used to sample the analog input voltage V1.

Figure 10:
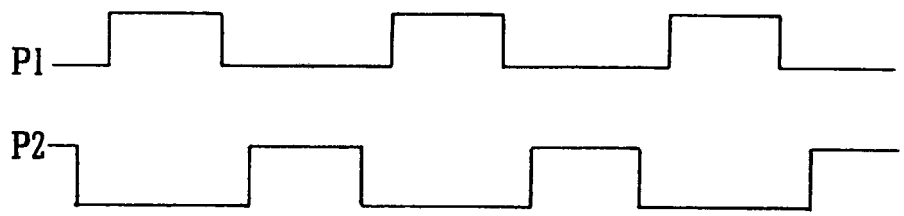
FIG. 10 is a timing diagram showing two phases of a non-overlapping clock signal.
Figure 11:
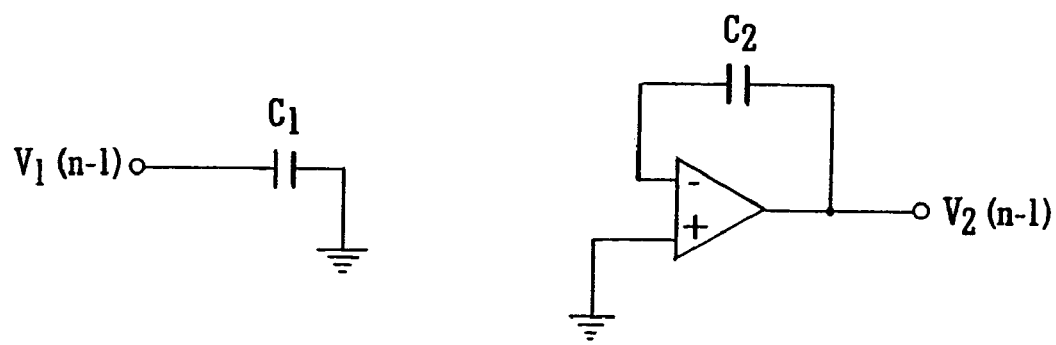
FIG. 11 shows an equivalent circuit for the integrator of FIG. 9 during Phase 1 of the clock signal.
Figure 12:
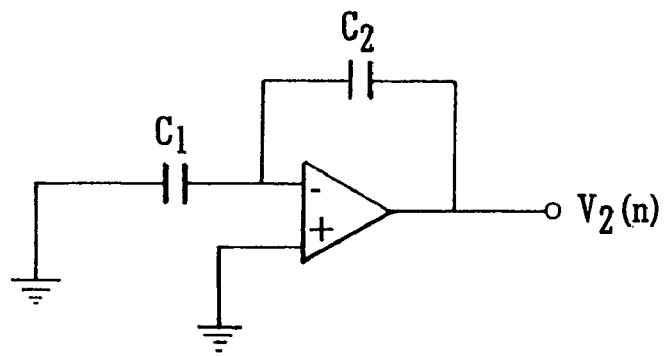
FIG. 12 shows an equivalent circuit for the integrator of FIG. 9 during Phase 2 of the clock signal.

Central to the operation of the switched capacitor integrator is the array of analog switches 901–904 controlled by selected phases of non-overlapping clock signals $\phi_1$ and $\phi_2$, as shown in FIG. 10. FIG. 11 illustrates the actual circuit configuration during $\phi_1$, when switches 901 and 902 are closed, and switches 903 and 904 are open. Describing circuit operation in terms of charge Q and referring to FIG. 11, one can see that during ($\phi_1$ $Q_1(n-1)=C_1V_1(n-1)$ and
$Q_2(n-1)=C_2V_2(n-1)$ Using a similar charge analysis during $\phi_2$ and referring to FIG. 12, which depicts circuit configuration when switches 903 and 904 are closed and switches 901 and 902 are open, one can see that $Q_2(n)=C_2V_2(n)$ Applying charge conservation to the result:
$Q_2(n)=Q_2(n-1)+Q_1(n-1)$
$C_2V_2(n)=C_2V_2(n-1)+C_1V_1(n-1)$ Taking the z-transform:
$V_2=V_2Z^{-1}+(C1/C2)V_1^{z-1}$ Thus:
$V_2/V_1=(C_1/C_2)(z^{-1})/(1-z^{-1})$ The non-inverting integrator clearly includes delay. The important thing to note is that the voltage $V_2$ is related to $V_1$ by the ratio of the capacitance $C_1$ to $C_2$. If one were to implement $C_1$ precisely as illustrated for the $C_H$ capacitors of FIG. 8, it is clear that one can program the input range into the dynamic range of the converter. It may help to think of $V_2$ as the voltage applied to the converter, and $V_1$ as the actual analog input voltage.

Figure 8:
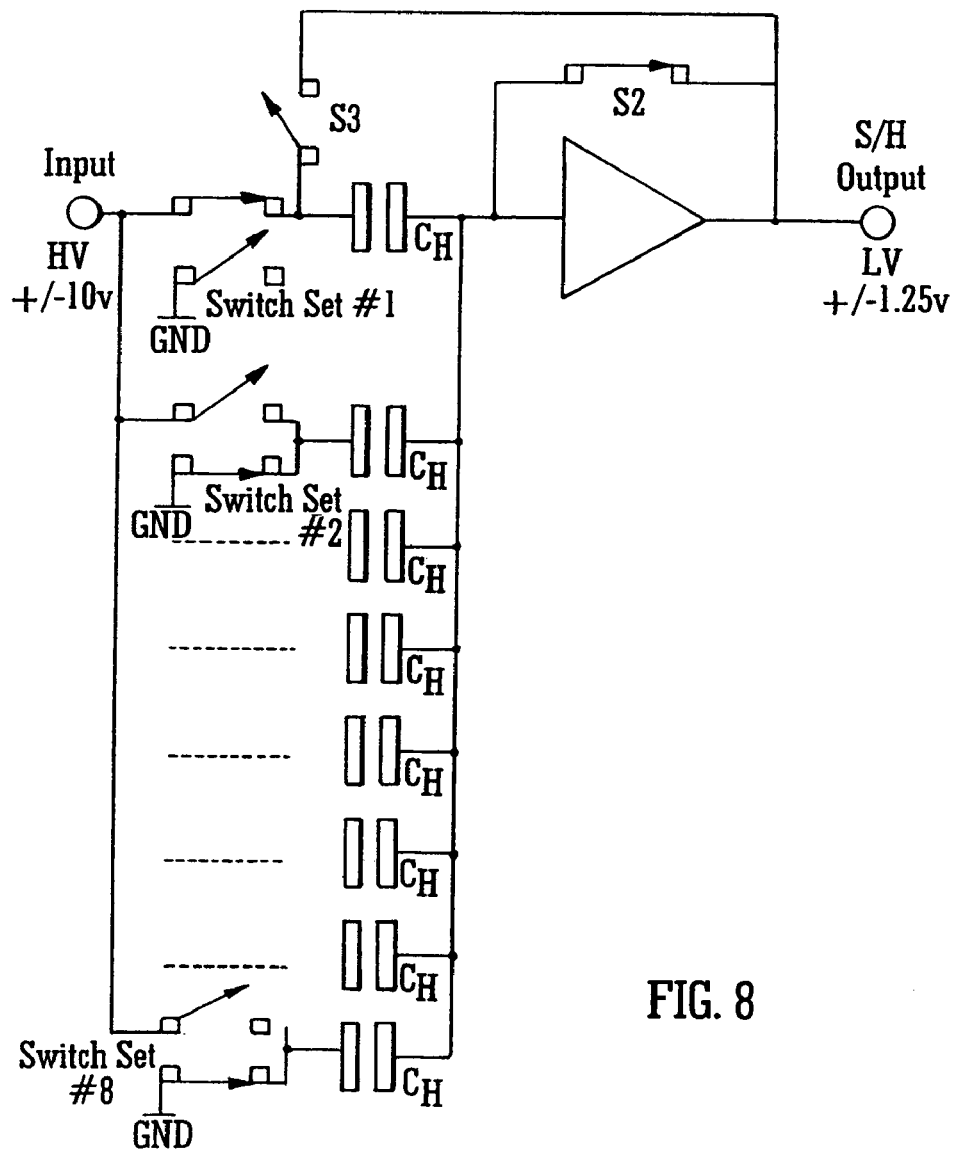
FIG. 8 depicts, in schematic diagram form, how an analog input signal applied to a sample and hold circuit can be scaled to a desired range.
Figure 13:
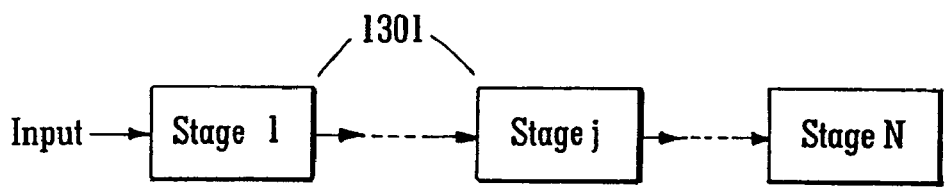
FIG. 13 illustrates a basic pipeline converter architecture in block diagram form.
Figure 14:
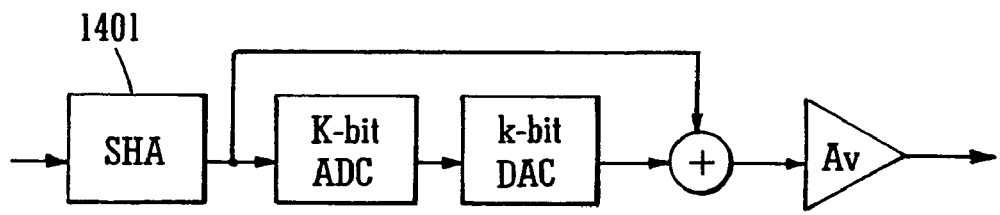
FIG. 14 is a simplified block diagram of a single stage of the pipeline converter of FIG. 13.

Pipeline converters are also perfectly suitable for use in a programmable input range system in accordance with the present invention. FIG. 13 illustrates that a pipeline converter is simply a cascaded arrangement of identical stages 1301. Each individual stage of a pipeline converter looks much as depicted in FIG. 14. It should be noted that the first thing the analog input voltage sees in a pipeline architecture is a SHA (sample-and-hold amplifier) circuit. As outlined above, one can manipulate the SHA circuit (as shown in FIG. 8) to take the wide dynamic range analog input signals, provided one has the high voltage switch technology available as described above.

There has been described herein a programmable input range SAR ADC that offers distinct advantages when compared with the prior art. It will be apparent to those skilled in the art that modifications may be made without departing from the spirit and scope of the invention. Accordingly, it is not intended that the invention be limited except as may be necessary in view of the appended claims.

What is claimed is:

1. A programmable input voltage range analog-to-digital converter comprising:
   an analog-to-digital converter (ADC) having a characteristic dynamic range; and
   an input voltage scaling network in which the input voltage is sampled onto one or more selected sampling capacitors to scale the input voltage to substantially match the characteristic dynamic range of the ADC.

2. The programmable input voltage range analog-to-digital converter of claim 1, wherein the input voltage scaling network comprises an array of parallel-connected sampling capacitors in an input amplifier providing a sampled input voltage to the ADC.

3. The programmable input voltage range analog-to-digital converter of claim 2, wherein the sampling capacitors are interposed between the analog input voltage and an input amplifier from which the sampled output signal is derived.

4. The programmable input voltage range analog-to-digital converter of claim 3, wherein the ADC is a sigma-delta converter.

5. The programmable input voltage range analog-to-digital converter of claim 3, wherein the ADC is a pipeline converter.

6. The programmable input voltage range analog-to-digital converter of claim 3, wherein the ADC is a successive approximation converter.

7. The programmable input voltage range analog-to-digital converter of claim 1, further comprising a network of high voltage sampling switches interposed between the input voltage and the input voltage scaling network.

8. The programmable input voltage range analog-to-digital converter of claim 7, further comprising range decoder logic that selects one or more elements of the input voltage scaling network on which the input voltage is sampled.

9. The programmable input voltage range analog-to-digital converter of claim 8, wherein the input voltage range is bipolar.

10. The programmable input voltage range analog-to-digital converter of claim 9, wherein a network of low-voltage to high-voltage level shifters couples control signals to the high voltage sampling switches.

11. The programmable input voltage range analog-to-digital converter of claim 8, wherein the range decoder logic is responsive to a range selection control word written into an associated range register.

12. The programmable input voltage range analog-to-digital converter of claim 11, wherein the range register is programmable via a digital communication interface.

13. The programmable input voltage range analog-to-digital converter of claim 12, wherein the digital communication interface is a serial communication interface.

14. The programmable input voltage range analog-to-digital converter of claim 13, wherein the serial communication interface is bi-directional.

15. A programmable input voltage range analog-to-digital converter comprising:
   an analog-to-digital converter (ADC) having a characteristic dynamic range; and
   an input voltage scaling network including an array of parallel-connected sampling capacitors in an input amplifier providing a sampled input voltage to the ADC;
   such that the input voltage is sampled onto one or more selected sampling capacitors to scale the input voltage to substantially match the characteristic dynamic range of the ADC.

16. The programmable input voltage range analog-to-digital converter of claim 15, wherein the sampling capacitors are interposed between the analog input voltage and the input amplifier from which the sampled output signal is derived.

17. The programmable input voltage range analog-to-digital converter of claim 16, wherein the ADC is a sigma-delta converter.

18. The programmable input voltage range analog-to-digital converter of claim 16, wherein the ADC is a pipeline converter.

19. The programmable input voltage range analog-to-digital converter of claim 16, wherein the ADC is a successive approximation converter.

20. The programmable input voltage range analog-to-digital converter of claim 15, further comprising a network of high voltage sampling switches interposed between the input voltage and the input voltage scaling network.

21. The programmable input voltage range analog-to-digital converter of claim 20, further comprising range decoder logic that selects one or more elements of the input voltage scaling network on which the input voltage is sampled.

22. The programmable input voltage range analog-to-digital converter of claim 21, wherein the input voltage range is bipolar.

23. The programmable input voltage range analog-to-digital converter of claim 22, wherein a network of low-voltage to high-voltage level shifters couples control signals to the high voltage sampling switches.

24. The programmable input voltage range analog-to-digital converter of claim 21, wherein the range decoder logic is responsive to a range selection control word written into an associated range register.

25. The programmable input voltage range analog-to-digital converter of claim 24, wherein the range register is programmable via a digital communication interface.

26. The programmable input voltage range analog-to-digital converter of claim 25, wherein the digital communication interface is a serial communication interface.

27. The programmable input voltage range analog-to-digital converter of claim 26, wherein the serial communication interface is bi-directional.

28. A programmable input voltage range analog-to-digital converter comprising:
   an analog-to-digital converter (ADC) having a characteristic dynamic range;
   an input voltage scaling network including an array of parallel-connected sampling capacitors in an input amplifier providing a sampled input voltage to the ADC, such that the input voltage is sampled onto one or more selected sampling capacitors to scale the input voltage to substantially match the characteristic dynamic range of the ADC;
   a network of high voltage sampling switches interposed between the input voltage and the input voltage scaling network, such that the input voltage is selectively sampled onto one or more of the sampling capacitors;
   range decoder logic that controls the network of high voltage sampling switches to select said one or more of the sampling capacitors; and
   a range register to which a range selection control word is written, the range decoder logic being responsive to the range selection control word.

29. The programmable input voltage range analog-to-digital converter of claim 28, wherein the ADC is a sigma-delta converter.

30. The programmable input voltage range analog-to-digital converter of claim 28, wherein the ADC is a pipeline converter.

31. The programmable input voltage range analog-to-digital converter of claim 28, wherein the ADC is a successive approximation converter.

32. The SAR ADC of claim 28, wherein the range register is programmable via an integral digital communication interface.

33. The programmable input voltage range analog-to-digital converter of claim 32, wherein the digital communication interface is a serial communication interface.

34. The programmable input voltage range analog-to-digital converter of claim 28, wherein the input voltage range is bipolar.

35. A programmable input voltage range analog-to-digital converter integrated circuit device fabricated on a single substrate, the device comprising:

an analog-to-digital converter (ADC) subsystem fabricated utilizing a standard sub-micron low-voltage CMOS process, and having a characteristic dynamic range;

an input voltage scaling network in which the input voltage is sampled onto one or more selected sampling capacitors to scale the input voltage to substantially match the characteristic dynamic range of the ADC; and a network of high-voltage MOS sampling switches fabricated utilizing a split gate oxide process to accommodate higher gate voltages, said network of high-voltage sampling switches interposed between the input voltage and the input voltage scaling network, such that the input voltage is selectively sampled onto one or more of the sampling capacitors.

36. The programmable input voltage range analog-to-digital converter integrated circuit device of claim 35, wherein the input voltage scaling network comprises an array of parallel-connected sampling capacitors in an input amplifier providing a sampled input voltage to the ADC.

37. The programmable input voltage range analog-to-digital converter integrated circuit device of claim 36, wherein the sampling capacitors are interposed between the analog input voltage and the input amplifier from which the sampled output signal is derived.

38. The programmable input voltage range analog-to-digital converter integrated circuit device of claim 37, wherein the ADC is a sigma-delta converter.

39. The programmable input voltage range analog-to-digital converter integrated circuit device of claim 37, wherein the ADC is a pipeline converter.

40. The programmable input voltage range analog-to-digital converter integrated circuit device of claim 37, wherein the ADC is a successive approximation converter.

41. The programmable input voltage range analog-to-digital converter integrated circuit device of claim 35, further comprising range decoder logic that selects one or more elements of the input voltage scaling network on which the input voltage is sampled.

42. The programmable input voltage range analog-to-digital converter integrated circuit device of claim 41, wherein the input voltage range is bipolar.

43. The programmable input voltage range analog-to-digital converter integrated circuit device of claim 42, wherein a network of low-voltage to high-voltage level shifters couples control signals to the high voltage sampling switches.

44. The programmable input voltage range analog-to-digital converter integrated circuit device of claim 41, wherein the range decoder logic is responsive to a range selection control word written into an associated range register.

45. The programmable input voltage range analog-to-digital converter integrated circuit device of claim 44, wherein the range register is programmable via a digital communication interface.

46. The programmable input voltage range analog-to-digital converter integrated circuit device of claim 45, wherein the digital communication interface is a serial communication interface.

47. The programmable input voltage range analog-to-digital converter integrated circuit device of claim 46, wherein the serial communication interface is bi-directional.

48. A programmable input voltage range analog-to-digital converter integrated circuit device fabricated on a single substrate, the device comprising:

an analog-to-digital converter (ADC) subsystem fabricated utilizing a standard sub-micron low-voltage CMOS process, and having a characteristic dynamic range;

an input voltage scaling network in which the input voltage is sampled onto one or more selected sampling capacitors to scale the input voltage to substantially match the characteristic dynamic range of the ADC;

a network of high-voltage MOS sampling switches fabricated utilizing a split gate oxide process to accommodate higher gate voltages, said network of high-voltage sampling switches interposed between the input voltage and the input voltage scaling network, such that the input voltage is selectively sampled onto one or more of the sampling capacitors;

range decoder logic that controls the network of high voltage MOS sampling switches to select said one or more of the sampling capacitors; and a range register to which a range selection control word is written, the range decoder logic being responsive to the range selection control word.

49. The programmable input voltage range analog-to-digital converter integrated circuit device of claim 48, wherein the ADC is a sigma-delta converter.

50. The programmable input voltage range analog-to-digital converter integrated circuit device of claim 48, wherein the ADC is a pipeline converter.

51. The programmable input voltage range analog-to-digital converter integrated circuit device of claim 48, wherein the ADC is a successive approximation converter.

52. The programmable input voltage range analog-to-digital converter integrated circuit device of claim 48, wherein the range register is programmable via a digital communication interface.

53. The programmable input voltage range analog-to-digital converter integrated circuit device of claim 52, wherein the digital communication interface is a serial communication interface.

54. The programmable input voltage range analog-to-digital converter integrated circuit device of claim 53, wherein the serial communication interface is bi-directional.

55. The programmable input voltage range analog-to-digital converter integrated circuit device of claim 48, wherein the input voltage range is bipolar.

* * * * *